US012801033B2

(12) United States Patent
Kooiman

(10) Patent No.: US 12,801,033 B2
(45) Date of Patent: Nov. 17, 2026

(54) MULTI-STEP PROCESS INSPECTION METHOD INCLUDING ANALYZING VARIATIONS IN FEATURES VISIBLE IN AN IMAGE AND ASSOCIATING FEATURES OF THE IMAGE WITH STEPS OF THE MULTI-STEP PROCESS BASED ON THE RESULTS OF THE ANALYZING

(71) Applicant: ASML Netherlands B.V., Veldhoven (NL)

(72) Inventor: Marleen Kooiman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 611 days.

(21) Appl. No.: 17/885,491

(22) Filed: Aug. 10, 2022

(65) Prior Publication Data

US 2022/0382163 A1 Dec. 1, 2022

Related U.S. Application Data

(63) Continuation of application No. PCT/EP2021/052726, filed on Feb. 5, 2021.

(30) Foreign Application Priority Data

Feb. 10, 2020 (EP) .................................... 20156290

(51) Int. Cl.
*G01N 23/2251* (2018.01)
*G03F 7/00* (2006.01)
(Continued)

(52) U.S. Cl.
CPC ........ *G03F 7/7065* (2013.01); *G03F 7/70633* (2013.01); *G06T 7/0004* (2013.01);
(Continued)

(58) Field of Classification Search
CPC ............. G06F 7/70466; G06F 7/70616; G06F 7/70633; G06F 7/7065; G06T 2207/10061;
(Continued)

(56) References Cited

U.S. PATENT DOCUMENTS

2010/0301458 A1 12/2010 Sewell et al.
2016/0123726 A1* 5/2016 Yamaguchi ........... H01J 37/222 250/306
(Continued)

FOREIGN PATENT DOCUMENTS

CN 109154781 A 1/2019
EP 3451060 A1 3/2019
(Continued)

OTHER PUBLICATIONS

Gunay-Demirkol, Anil et al., "Innovative scatterometry approach for Self-Aligned Quadruple Patterning (SAQP) process control," Proc. of SPIE vol. 9778 977807-02 (12 pgs.).
(Continued)

*Primary Examiner* — Chad Dickerson
(74) *Attorney, Agent, or Firm* — FINNEGAN, HENDERSON, FARABOW, GARRETT & DUNNER, LLP

(57) ABSTRACT

An image analysis method for identifying features in an image of a part of an array of features formed by a multi-step process, the method comprising:
analyzing variations in features visible in the image; and
associating features of the image with steps of the multi-step process based at least in part on results of the analyzing.

17 Claims, 9 Drawing Sheets

(51) Int. Cl.

| | |
|---|---|
| ***G06T 7/00*** | (2017.01) |
| ***G06V 10/22*** | (2022.01) |
| ***G06V 10/44*** | (2022.01) |

(52) U.S. Cl.
CPC .............. *G06V 10/22* (2022.01); *G06V 10/44* (2022.01); *G06T 2207/10061* (2013.01); *G06T 2207/30148* (2013.01)

(58) Field of Classification Search
CPC ........ G06T 2207/30148; G06T 7/0004; G06V 10/22; G06V 10/44
USPC .......................................................... 382/149
See application file for complete search history.

(56) References Cited

U.S. PATENT DOCUMENTS

| | | | | |
|---|---|---|---|---|
| 2016/0140287 | A1 | 5/2016 | Ojima et al. | |
| 2016/0188559 | A1* | 6/2016 | Maltz | H04N 1/3873 358/1.15 |
| 2016/0246185 | A1* | 8/2016 | Ypma | G03F 7/70508 |
| 2017/0040230 | A1* | 2/2017 | Yamaguchi | H01J 37/244 |
| 2018/0012349 | A1* | 1/2018 | Sakai | G01B 15/04 |
| 2018/0196356 | A1 | 7/2018 | Bozdog et al. | |
| 2020/0173940 | A1* | 6/2020 | Kooiman | G01N 23/2251 |
| 2022/0138973 | A1* | 5/2022 | Korb | G06T 5/80 382/151 |

FOREIGN PATENT DOCUMENTS

| | | | |
|---|---|---|---|
| JP | 2014519598 | A | 8/2014 |
| JP | 2015203614 | A | 11/2015 |
| JP | 2017067442 | A | 4/2017 |
| KR | 20160132048 | A | 11/2016 |
| WO | WO 2012/148848 | A2 | 11/2012 |
| WO | 2019162203 | A1 | 8/2019 |

OTHER PUBLICATIONS

Notice of Reasons for Rejection from the Japan Patent Office issued in related Japanese Patent Application No. 2022-546025; mailed Aug. 2, 2023 (6 pgs.).

* cited by examiner

MULTI-STEP PROCESS INSPECTION METHOD INCLUDING ANALYZING VARIATIONS IN FEATURES VISIBLE IN AN IMAGE AND ASSOCIATING FEATURES OF THE IMAGE WITH STEPS OF THE MULTI-STEP PROCESS BASED ON THE RESULTS OF THE ANALYZING

CROSS-REFERENCE TO RELATED APPLICATIONS

This application claims priority of International Application No. PCT/EP2021/052726, which was filed on Feb. 5, 2021, which claims priority of EP application 20156290.7 which was filed on Feb. 10, 2020, all of which are incorporated herein by reference in their entireties.

FIELD

The present disclosure relates to inspection methods, in particular for device manufacturing using lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In order to meet the continual desire in the lithographic art to reduce the size of features that can be formed (shrink), various processes have been proposed that involve multiple steps to create a single layer at a smaller size or pitch than can be formed in a single optical patterning step. Examples of such process include litho-etch-litho-etch (LELE), self-aligned double patterning (SADP) and self-aligned quadruple patterning (SAQP). These processes create difficulties for inspection and metrology processes.

SUMMARY

The present disclosure aims to provide improved metrology methods, e.g., for use in lithographic device manufacturing processes.

According to some embodiments there is provided an image analysis method for identifying features in an image of a part of an array of features formed by a multi-step process, the method comprising:

analyzing variations in features visible in the image; and associating features of the image with steps of the multi-step process based at least in part on results of the analyzing.

According to some embodiments there is provided a device manufacturing method comprising:

forming an array of features on a substrate using a multi-step process;

obtaining an image of a part of the array;

analyzing the image as described above to associate features to steps of the multi-step process;

detecting a defect in a feature of the array; and performing a remedial action based upon the association of features to steps and the detected defect.

According to some embodiments there is provided an image analysis apparatus for identifying features in an image of a part of an array of features formed by a multi-step process, the apparatus comprising:

an image analyzing module configured to analyze variations in features visible in the image; and an association module configured to associate features of the image with steps of the multi-step process based at least in part on results of the analyzing.

According to some embodiments there is provided a method of analyzing an image of a part of an array of features formed by a self-aligned quadruple patterning process, the method comprising:

identifying in the image a plurality of the features;

assigning a characteristic value to each identified feature, the characteristic value representing a positional or shape variation of the feature;

grouping the features into first, second, third and fourth groups, each group comprising a set of aligned features, the first, second, third and fourth groups being adjacent each other in that order;

determining a first correlation value between variations in the characteristic values of the first group and variations in the characteristic values of the second group;

determining a second correlation value between variations in the characteristic values of the second group and variations in the characteristic values of the third group;

associating the first and second groups with a first spacer of the self-aligned quadruple patterning process if the first correlation value is higher than the second correlation value and otherwise associating the second and third groups with the first spacer of the self-aligned quadruple patterning process.

BRIEF DESCRIPTION OF THE DRAWINGS/FIGURES

Embodiments will now be described, by way of example, with reference to the accompanying drawings in which.

DETAILED DESCRIPTION

Figure 1:
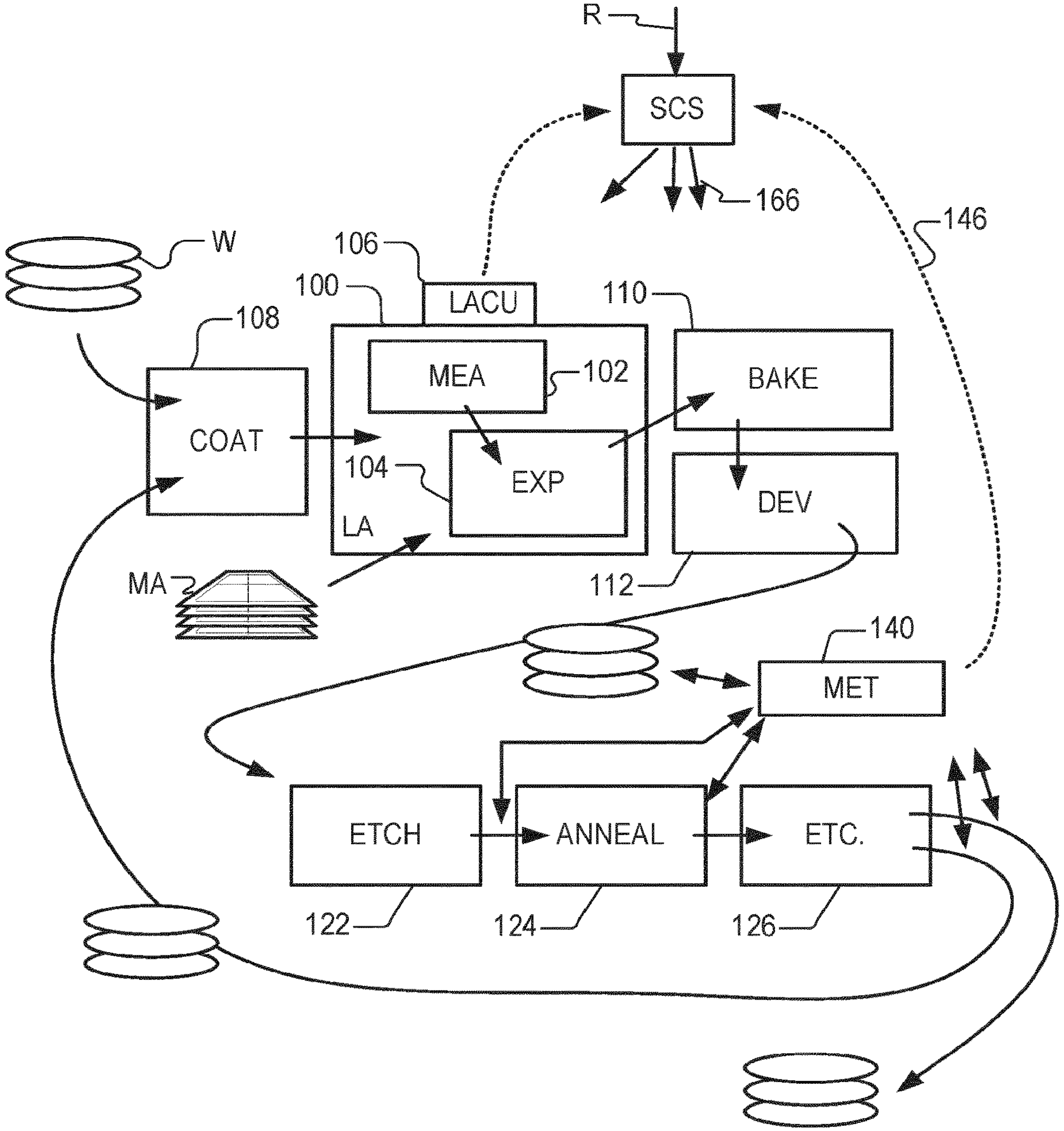
FIG. 1 depicts a lithographic apparatus together with other apparatuses forming a production facility for semiconductor devices.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smartphone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning electron microscope (SEM), an optical inspection system, etc. Such systems can be used to image these structures, in effect, taking a "picture" of the structures of the wafer, with a SEM being able to image the smallest of these structures. The image can be used to determine if the structure was formed properly in the proper location. If the structure is defective, then the process can be adjusted, so the defect is less likely to recur.

The key step in a lithographic manufacturing process for chips is an optical step in which an image of a feature is projected onto the substrate (wafer) but there are limits as to how small features can be formed in this way. To make even smaller features there are processes that use chemical steps to build several, e.g., four, smaller features based on one larger feature created by the optical step. In one example, one step creates every other feature, and a second step creates the ones in between. An example is lines used in high-capacity memory chips. Such ICs often have large areas filled with regular arrays of lines and if there is defect in one of the features it can be difficult to work out which step of the process formed the defective feature. Since the features are all supposed to be identical it may be necessary to count features from the edge of the array in order to determine in which step a particular feature was formed.

The present disclosure proposes a technique of identifying in which step of a multi-step process a given feature was formed by examining small variations in the shape and/or position of features of an array. The present inventor has determined that such variations, which are not large enough to affect the function of the device or be considered defects, have characteristics that depend on the process step in which they were formed. In one example, one process step generates similar variations in all of the features created in that step so that by examining correlations between variations in the features it is possible to identify the features created in that step.

Before describing embodiments in detail, it is instructive to present an example environment in which the techniques disclosed herein may be implemented.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles or other shapes aligned in accordance to a Cartesian two-dimensional coordinate system (e.g., aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may give rise to an overlay error (often referred to as "overlay"). The overlay is the error in placing a first product feature within a first layer relative to a second product feature within a second layer. The lithographic apparatus reduces the overlay errors by aligning each wafer accurately to a reference prior to patterning. This is done by measuring positions of alignment marks which are applied to the substrate. Based on the alignment measurements the substrate position is controlled during the patterning process in order to prevent occurrence of out of tolerance overlay errors. Alignment marks are typically created as part of the product image forming the reference to which overlay is measured. Alternatively, alignment marks of a previously formed layer can be used.

An error in a critical dimension (CD) of the product feature may occur when the applied dose associated with the exposure 104 is not within specification. For this reason, the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus reduces these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. Common examples of a metrology apparatus are scatterometers and scanning electron microscopes. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. A CD metrology target is used for measuring the result of the most recently exposed layer. An overlay target is used for measuring the difference between the positions of the previous and most recent layers. An electron beam (e-beam) based inspection tool such as a scanning electron microscope (SEM) can often provide superior results in the measurement of small overlay and CD values.

Within a semiconductor production facility, lithographic apparatus 100 and metrology apparatus 140 form part of a “litho cell” or “litho cluster”. The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus is configured to inspect substrates after development 112 or after further processing (e.g., etching). The various apparatus within the litho cell are controlled by a supervisory control system SCS, which issues control signals 166 to control the lithographic apparatus via lithographic apparatus control unit (LACU) 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates. The SCS can be one computer or multiple computers, which may or may not communicate. The recipe R can be implemented as one recipe or as multiple independent recipes. For example, the recipe for a process step such as etch may be totally independent of the recipe to inspect the result of that process step (e.g., etch). For example, two or more recipes for individual steps may be interrelated such that one recipe is adjusted to take account of the results of performance of another recipe on the same or a different substrate.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example, context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

Self-Aligned quadruple patterning (SAQP), which may also be referred to as sidewall assisted quadruple patterning, is a technique to create features at one quarter the pitch of a feature created by an optical exposure (lithography) step. SAQP has been developed to print lines or regular holes at a more dense pitch without using reducing the exposure wavelength. This process will be explained with reference to FIGS. 2A to 2F.

Figure 2A:
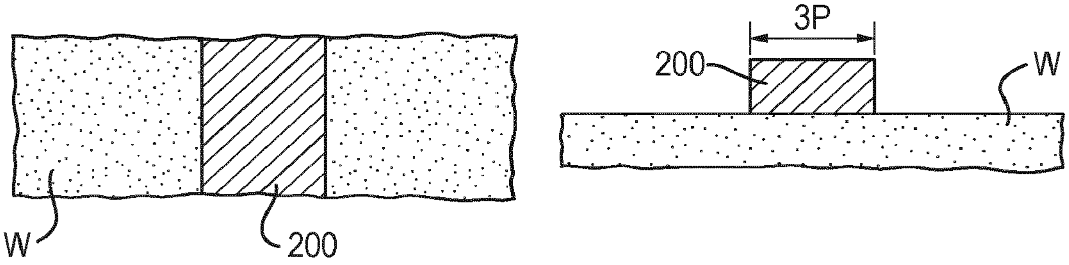
FIGS. 2A to 2F depict steps in a self-aligned quadruple patterning process.
Figure 2B:
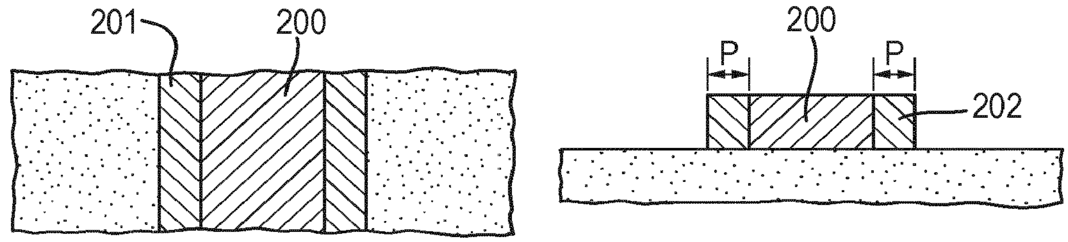

In each of FIGS. 2A to 2F the left hand part is a plan view of the result of a process step and the right part is a cross-sectional view. In the first step, a resist feature 200, e.g., a line, is formed on the wafer. The line has a width equal to 3P and is part of an array of similar lines with pitch 8P. In a second step, a conformal coating process is performed to apply a first spacer 201 on each of the side walls of resist feature 200 as shown in FIG. 2B. The coating process is carefully controlled so that the first spacers 201 each have a width P.

Figure 2C:
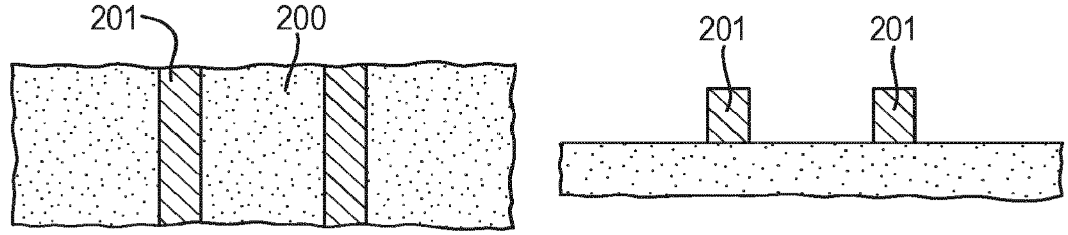
Figure 2D:
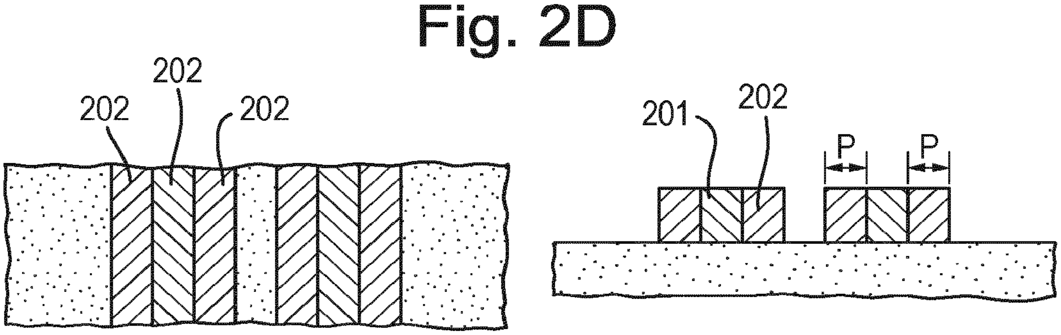

The original resist feature 200 is removed so as to leave the two first spacers 201, which are now separated by a gap of width 3P as shown in FIG. 2C. A second conformal coating process is then performed to form second spacer layers 202 on each side of each of first spacers 201 as shown in FIG. 2D. Again, the coating process is carefully controlled so that the second spacers 202 each have a width P. This leaves a gap between two spacer clusters of width P.

Figure 2E:
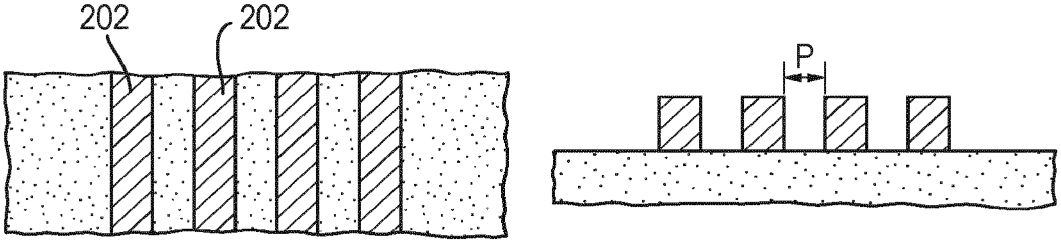
Figure 2F:
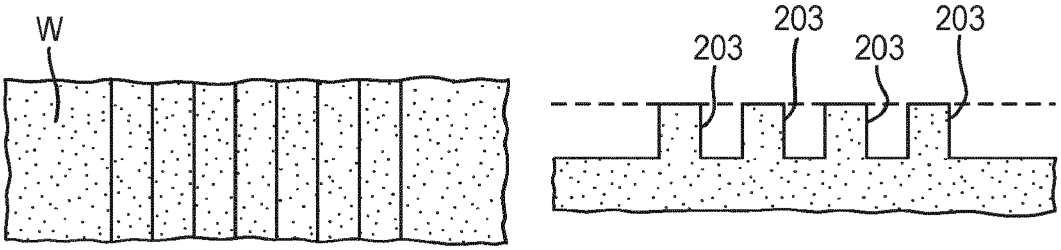

The first spacers 201 are then removed chemically so as to leave just the second spacers 202 as shown in FIG. 2E. Each of the second spacers 202 has a width P and the gaps between the second spacers 202 also have a width P. Thus, the pitch of the new pattern is 2P whereas that of the original was 8P. Finally, a pattern transfer step, such as an etch step, is performed and the spacers removed (if they are not removed during the etch process) to result in a set of trenches 203 as illustrated in FIG. 2F.

It will be appreciated that the above process represents an idealized version of the SAQP process. In reality, there will be some variation from the ideal (or nominal) pattern in feature position (e.g., due to overlay) and/or width (CD error). Thus, overlay, CD and CD uniformity (CDu) errors as well as random fluctuations and defects can result in the lithographically-defined feature 200 having non-straight edges. The effect of this is illustrated in FIGS. 3A to D, where the variations from nominal feature size are exaggerated.

Figure 3A:
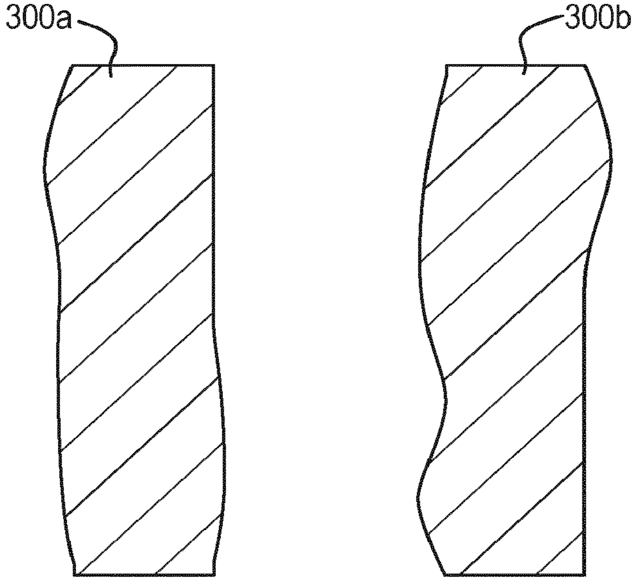
FIGS. 3A to 3D depict the effects of errors in a self-aligned quadruple patterning process.
Figure 3B:
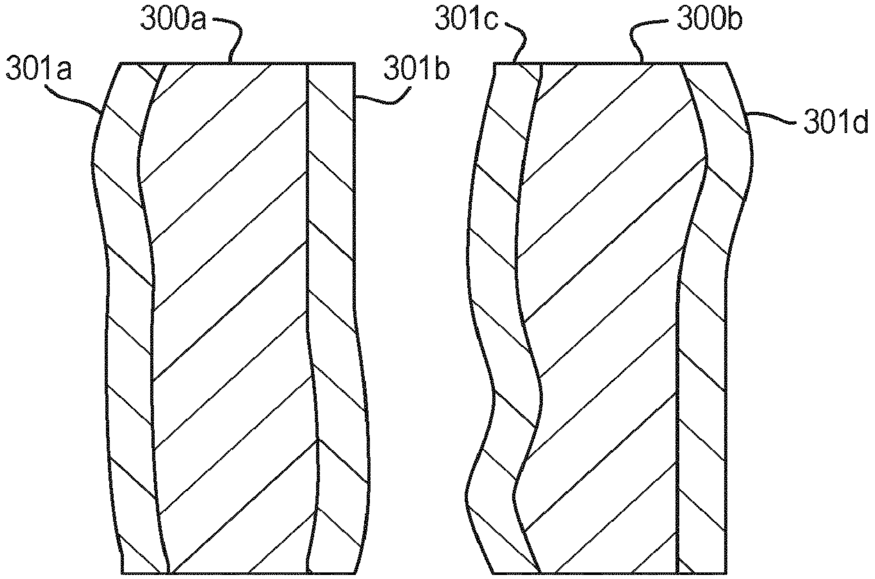
Figure 3C:
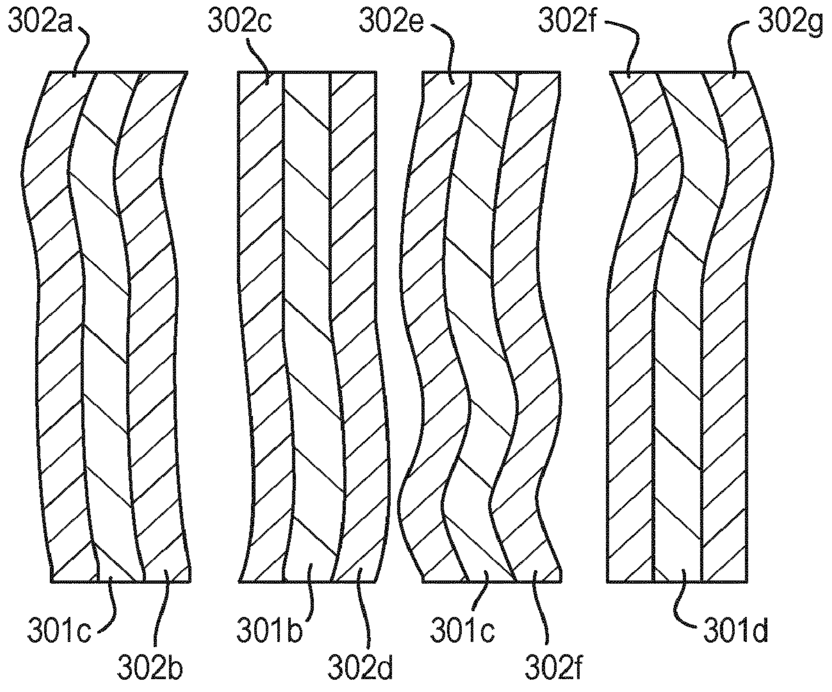
Figure 4:
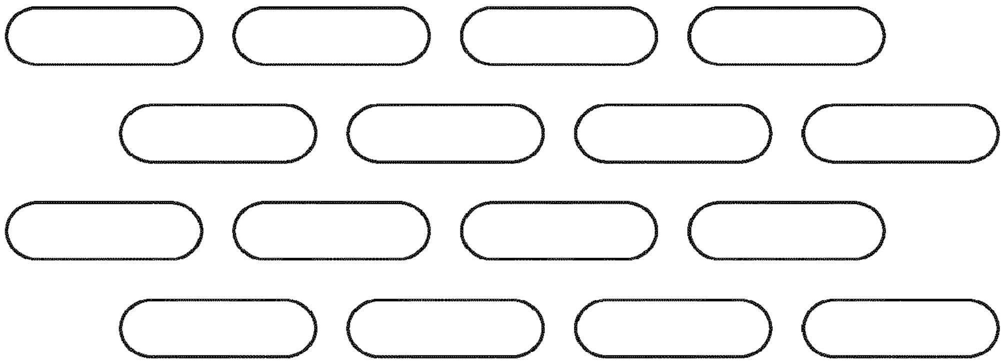
FIG. 4 depicts an example of an image of a part of an array of features.
Figure 5:
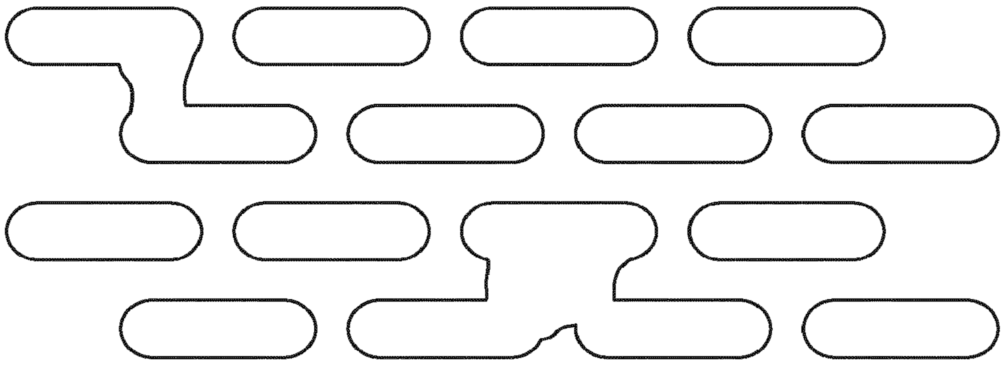
FIG. 5 depicts an example of an image of a part of an array of features including defects.
Figure 6:
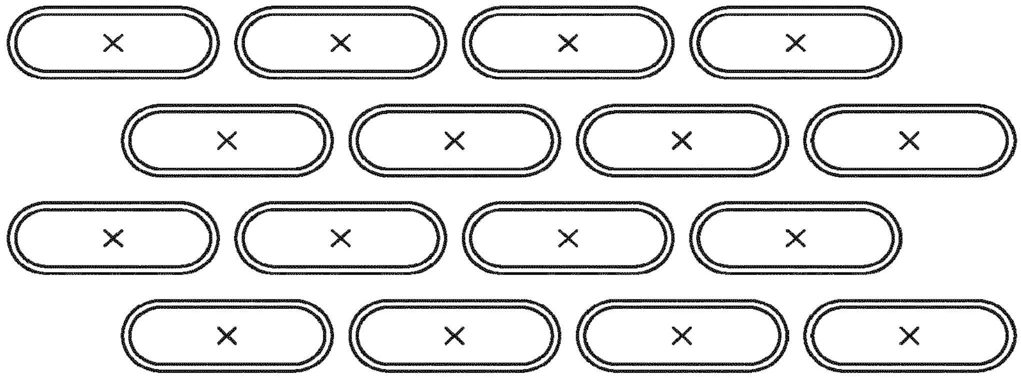
FIG. 6 depicts an example of the result of a process for contouring and determining the center-of-mass of features

FIG. 3A shows two adjacent lithographically-defined features 300*a*, 300*b*, in this example lines, which have variations in their edges. When a conformal coating process is performed to create first spacers 301*a* to 301*d*, as shown in FIG. 3B, the first spacers take up the shape of the respective edge of the lithographically-defined features 300*a*, *b* and therefore are not straight. It is possible that variations in the width of the first spacers may also occur at this stage. Second spacers 302*a* to 302*g* are formed in a second conformal coating process, as shown in FIG. 3C and then the first spacers 301*a* to 301*d* are removed to reach the final stage shown in FIG. 3D. In FIG. 3 the equivalent lines are labelled 0, 1, 2 and 3.

Where variations occur, it is valuable to the lithographer to know which line in the final pattern corresponds to which line in the intermediate process steps, as this allows the lithographer to see which process step is most error-prone and should thus be optimized. One approach to finding out what is what in the final pattern is to take addressed SEM images, i.e. SEM images of known locations in the pattern. However, in many cases the accuracy of addressing of the SEM is not sufficient to provide confidence of which line is which based on position in the image. FIG. 4 is s sketch indicating what such an image looks like. Since the line width may be about 20 to 30 nm it will be seen that a positioning error of the SEM image of that order will lead to misattribution of the lines in the image. FIG. 5 is a sketch similar to FIG. 4 but showing a case where some features have merged to form defects.

It should be noted that FIGS. 4 and 5 depict arrays of features after a cut process step has been performed so that the original line features are each divided into a plurality of shorter, but still elongate, line segments. The present techniques can be applied to images of arrays of lines prior to the cut step or to images of arrays of features after a cut step. In the latter case the line segments in a column or region that derived from the same line feature may be grouped together and treated as one feature. It should be noted that a pattern of elongate features may have the features aligned with either the x or y axes of the lithography apparatus or at an intermediate angle. The coordinate system of the SEM desirably aligns with the coordinate system of the lithography apparatus but need not do so.

A possibility to provide greater certainty as to which line is which is to image the boundary of the array and count lines from the boundary to determine which line is which. However, this approach has the disadvantage that only a small portion of the array can be imaged, and that the boundary of the array might be more error-prone by itself. In addition, just imaging the sides or corners of the array might not be representative.

Accordingly, the present disclosure provides a method to determine which lines in an array are associated with which process steps in a multi-step process, for example, which gaps correspond to the first spacer in an SAQP process by correlating the fluctuations in placement of neighboring lines.

The techniques disclosed herewith are applicable to a variety of multi-step processes, i.e., process in which a single lithographically-defined feature is converted through additional process steps into multiple features in the final device. The present technique is particularly applicable where the multi-step process includes a conformal coating process, i.e., a process that forms a layer of constant width or thickness.

Figure 3D:
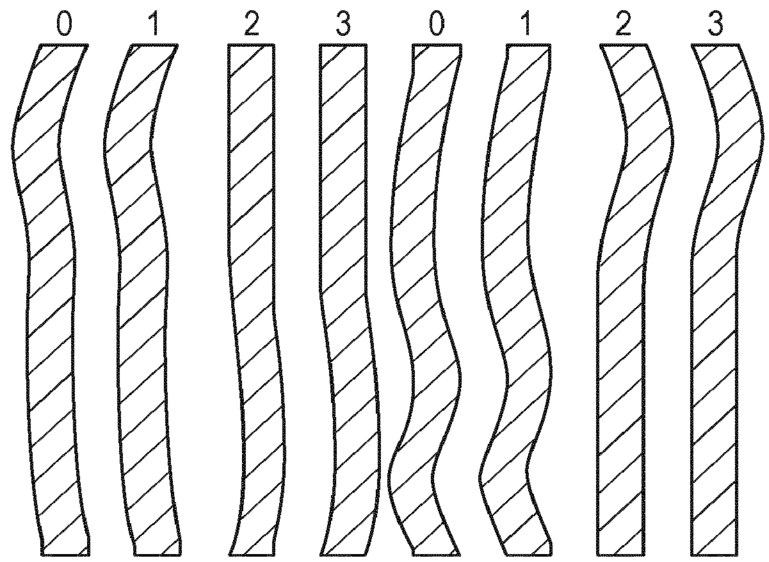

From FIG. 3D, it can be seen that the lines indicated with 0 and 1 have similar contours and have the same fluctuations. The reason for this is that the deposition step is usually very conformal, as it is done with ALD (Atomic Layer Deposition). Therefore, the variation in placement that occurs is the same as the original Line Edge Roughness (LER) on the left of the left printed line in the first lithographic step (FIG. 3A) and the gap between these lines corresponds to the first spacer 301*a*. The correlation of the fluctuations in placement between line 0 and 1 is thus expected to be high.

For the same reason, the correlation in placement between lines 2 and 3 is expected to be high, while it is expected that the correlation in placement between line 1 and 2, or between line 3 and 0 will be lower or not significant. Hence, by determining the correlation in placement between neighboring lines, it is expected that the correlation between two of the four neighboring line pairs (0-1, 1-2, 2-3, 3-4) is large, while for the other two, it is small. The large correlation then corresponds to gaps due to the first spacer.

Figure 8:
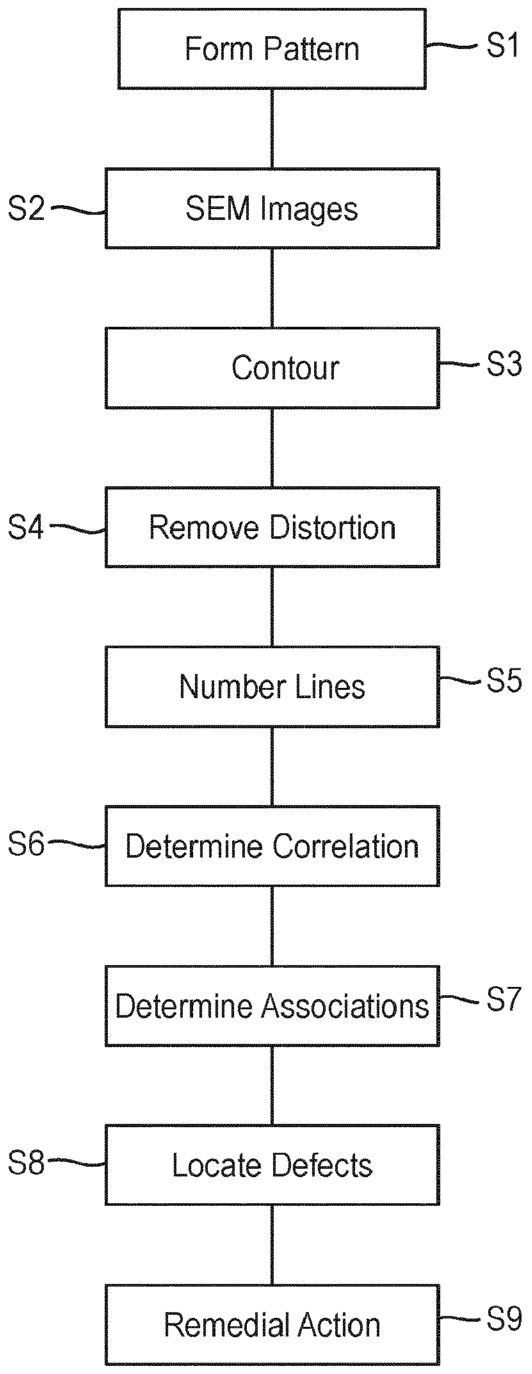
FIG. 8 is a flow chart of a method of device manufacture.

A more detailed example procedure will now be described with reference to FIG. 8.

A pattern comprising an array of features in a single layer is formed S1 on a substrate and imaged S2 using a scanning electron microscope or similar tool. The pattern is formed in a multi-step process, such as SAQP, wherein different features, or parts of features, may be defined by different steps of the multi-step process. The imaging step may be performed after the pattern is transferred into the substrate, e.g., by an etch feature, or when the pattern is still defined by sacrificial features, such as spacers.

Processing the image from the SEM begins with a process to contour S3 the structures and then determine the center of each structure. Any suitable algorithm for determining the contours of an object in an image can be used. In particular it is desirable to select an algorithm specifically adapted to the shape of the structures to be contoured. The center of a feature may be defined as its center of mass, but other definitions of the center of a feature are possible. Examples include the center of area, the geometric midpoint (i.e., the point midway between extreme points of the contour in two orthogonal directions, e.g. x and y), the centerline. The embodiments of the present disclosure can also make use of other characteristics of the features, such as positions of edges or magnitudes of dimensions, such as line widths. A center point or centerline may be defined with respect to a part of a feature. A weighting may be applied to points, e.g., boundary points, to calculate an average position.

In some cases, it may be desirable to remove distortion S4 from the SEM image, in particular by decomposing the grid distortion of the determined centers of mass into a static and time-varying SEM contribution, and a real distortion on wafer. A suitable method for this is described in European Patent Application 18210026.3, which document is hereby incorporated by reference. Removal of distortion can also be performed before contouring and determination of centers of mass, but the amount of processing required is reduced if performed on the centers of mass. Not removing distortion may reduce, but not eliminate, differences in correlation value that are obtained and used later in the process.

The next step is to label S5, e.g., number, all lines of structures. Suitable label schemes include 0, 1, 2, 3, 0, 1, 2, etc. It is arbitrary which line is called 0.

Figure 7:
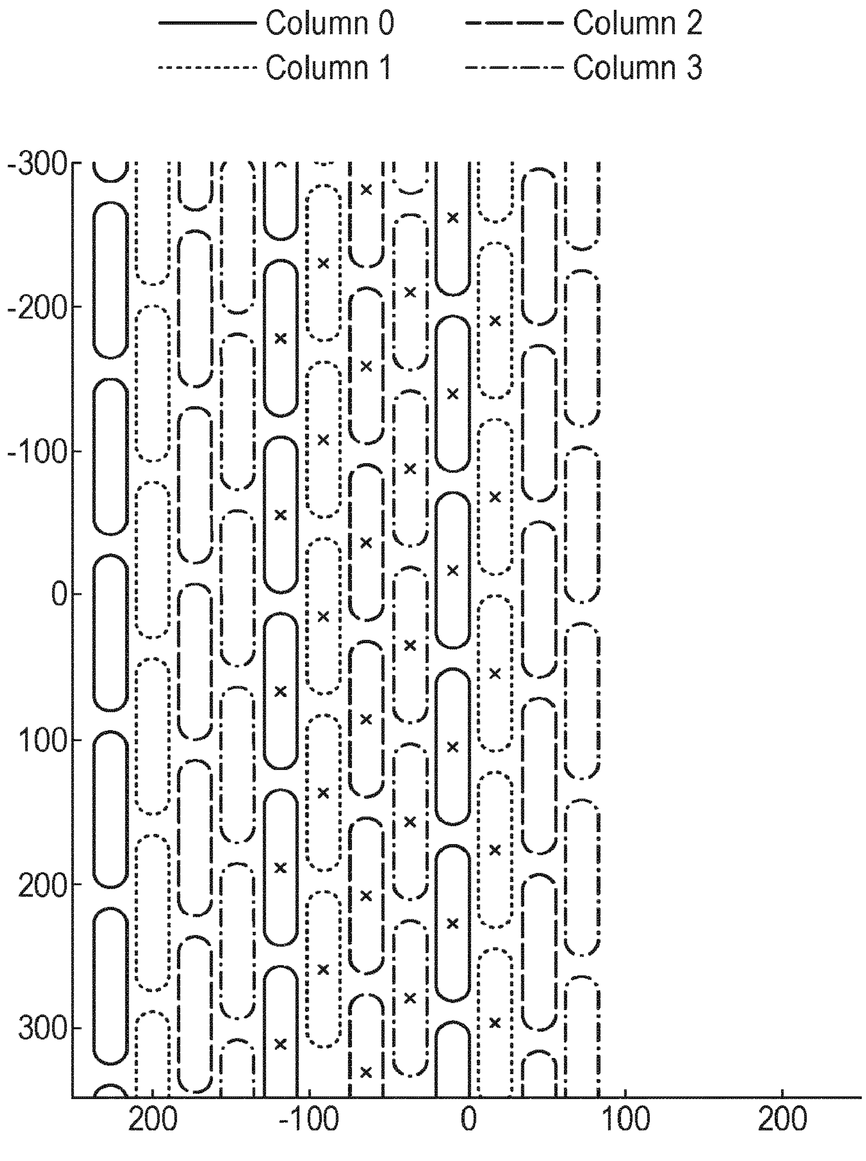
FIG. 7 depicts grouping of features into columns.

Then the coefficient of multiple correlation between structures in a given line, and multiple neighboring structures in the lines next to that line is determined S6. This is shown in FIG. 7 which shows labeled columns (or groups) of features with their centers indicated by crosses. To determine the coefficient of multiple correlation, for the part of the variance of the placement of the structure in a given line, explained by the position fluctuation of holes in the neighboring line, we define the vector of correlations:

$$\vec{c}=(r_{P_{left},P_{right,1}}, \ldots, r_{P_{left},P_{right,6}})^T \qquad (1)$$

where P_left is the placement of the left hole, P_(right,i) is the placement of the ith neighbor to the right, and r is the correlation coefficient.

Furthermore, we define the correlation matrix of the neighboring structures in the right line Q, with $$Q_{i,j}=r_{P_{right,i},P_{right,j}}. \qquad (2)$$

Then, the coefficient of multiple correlation can be computed by:

$$R^2=\vec{c}^{\,T}\cdot Q^{-1}\cdot\vec{c} \qquad (3)$$

In experiments carried using 15 different images of instances of a pattern formed using SAQP, a large $R^2$ was observed between two pairs of neighboring lines but a small correlation for the other two pairs. The line pairs with the larger correlation are associated S7 with the first spacer and the line pairs with the smaller correlation are associated with the second spacer.

Defects in the pattern imaged by the SEM are detected S8. Defect detection may be carried out before, after or in parallel with the above steps to associate lines with specific process steps. By combining knowledge of which feature is associated with which process step and defect locations, it is possible to determine remedial action to be taken S9. Possible forms of remedial action may range from adjusting the process to be applied to subsequent substrates to reworking already processed substrates. In some cases, defects may be addressed by adjustments to subsequent steps performed on the same substrate. In some cases, remedial action may comprise scrapping out-of-spec substrates before performing further work on them. Any action that is intended to improve yield or throughput or otherwise address a detected defect may be considered as remedial action.

Other features that the techniques disclosed herein may be used with include cuts for SADP and SAQP processes. It is possible to use the techniques described herein to analyze correlations in the placement of such cut features.

Another possibility is to measure lines before cuts are made and to determine the power spectral density (PSD) of the correlation. This can provide a stronger signal to identify different features and therefore can be more relevant for 'better printed' cases with less LER.

Also, the high-frequency content of the PSD of the LER can be studied for all edges. Specifically, it is expected that in some cases there will we be a difference in high frequency content on the inside and outside of the original lithographically-defined line, such that also the position of the original lithographically-defined line (gap 1-2 or gap 3-0) can be determined.

The techniques described herein thus enable to distinguish between gaps from first spacer and lines and spaces of the original lithographically-defined pattern without good addressing of the SEM.

While specific techniques have been described above, it will be appreciated that the disclosure may be practiced otherwise than as described.

Some embodiments may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to optical lithography, it will be appreciated that the techniques disclosed herein may be used in other applications, for example imprint lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Aspects of the present disclosure are set out in the following numbered clauses:

1. An image analysis method for identifying features in an image of a part of an array of features formed by a multi-step process, the method comprising:
   analyzing variations in features visible in the image; and
   associating features of the image with steps of the multi-step process based at least in part on results of the analyzing.
2. A method according to clause 1 wherein the variations are variations in the position or shape of the features.
3. A method according to clause 2 wherein the variations are variations in the position of one or more of:
   centers of mass of the features
   geometric midpoints of the features
   centerlines of the features
   edges of the features
   dimensions of the features
   centers of parts of the features
4. A method according to any one of clauses 1 to 3 wherein the analyzing comprises analyzing correlations between the variations of different features.
5. A method according to clause 4 wherein the analyzing comprises determining the correlation between variations of a first feature and variations of each of n adjacent features, where n is less than 4.
6. A method according to clause 4 wherein the analyzing comprises determining the correlation between variations of adjacent features.
7. A method according to clause 4, 5 or 6 wherein the associating associates features having correlated variations to a same process step.
8. A method according to clause 4, 5, 6 or 7 wherein the associating divides the features into a plurality of sets having similar levels of correlation and associates each set to a respective one of the process steps.
9. A method according to any one of preceding clauses wherein the analyzing comprises selecting a plurality of regions of the image, each region including a plurality of features, and determining correlations between the features of different regions.
10. A method according to clause 9 wherein each region includes a plurality of aligned features.
11. A method according to any one of the preceding clauses wherein the multi-step process includes a step of conformal deposition.
12. A method according to any one of preceding clauses wherein the analyzing comprises determining a contour of each of the features.
13. A method according to any one of preceding clauses wherein the image is an image obtained by a scanning electron microscope.

14. A device manufacturing method comprising:
forming an array of features on a substrate using a multi-step process;
obtaining an image of a part of the array;
analyzing the image according to the method of any one of clauses 1 to 13 to associate features to steps of the multi-step process;
detecting a defect in a feature of the array; and
performing a remedial action based upon the association of features to steps and the detected defect.
15. An image analysis apparatus for identifying features in an image of a part of an array of features formed by a multi-step process, the apparatus comprising:
an image analyzing module configured to analyze variations in features visible in the image; and
an association module configured to associate features of the image with steps of the multi-step process based at least in part on results of the analyzing.
16. Apparatus according to clause 15 wherein the variations are variations in the position or shape of the features.
17. Apparatus according to clause 16 wherein the variations are variations in the position of one or more of:
centers of mass of the features
geometric midpoints of the features
centerlines of the features
edges of the features
dimensions of the features
centers of parts of the features.
18. Apparatus according to any one of clauses 15 to 17 wherein the image analyzing module is configured to analyze correlations between the variations of different features.
19. Apparatus according to any one of clauses 15 to 17 wherein the image analyzing module is configured to determine the correlation between variations of a first feature and variations of each of n adjacent features, where n is less than 4.
20. Apparatus according to clause 18 wherein the image analyzing module is configured to determine the correlation between variations of adjacent features.
21. Apparatus according to clause 18, 19 or 20 wherein the association module is configured to associate features having correlated variations to a same process step.
22. Apparatus according to any one of clauses 18 to 21 wherein the association module is configured to divide the features into a plurality of sets having similar levels of correlation and to associate each set to a respective one of the process steps.
23. Apparatus according to any one of clauses 15 to 22 wherein the image analyzing module is configured to select a plurality of regions of the image, each region including a plurality of features, and determine correlations between the features of different regions.
24. Apparatus according to clause 22 wherein each region includes a plurality of aligned features.
25. Apparatus according to any one of clauses 15 to 24 wherein the multi-step process includes a step of conformal deposition.
26. Apparatus according to any one of clauses 15 to 25 wherein the analyzing comprises determining a contour of each of the features.
27. An inspection apparatus comprising a scanning electron microscope and an image analysis apparatus according to any one of clauses 15 to 26 configured to analyze images generated by the scanning electron microscope.
28. A method of analyzing an image of a part of an array of features formed by a self-aligned quadruple patterning process, the method comprising:
identifying in the image a plurality of the features;
assigning a characteristic value to each identified feature, the characteristic value representing a positional or shape variation of the feature;
grouping the features into first, second, third and fourth groups, each group comprising a set of aligned features, the first, second, third and fourth groups being adjacent each other in that order;
determining a first correlation value between variations in the characteristic values of the first group and variations in the characteristic values of the second group;
determining a second correlation value between variations in the characteristic values of the second group and variations in the characteristic values of the third group;
associating the first and second groups with a first spacer of the self-aligned quadruple patterning process if the first correlation value is higher than the second correlation value and otherwise associating the second and third groups with the first spacer of the self-aligned quadruple patterning process.
29. A method according to clause 17 wherein the characteristic value is one of:
position of the center of mass of the feature
position of the geometric midpoint of the feature
position of the centerline of the feature
position of an edge of the feature
a dimension of the feature
a position of a center of a part of the feature.
30. A method according to clause 28 or 29 wherein the features are line features, with or without cuts.
31. A method of identifying pairs of features that were generated from one edge of a printed feature by use of a manufacturing process including a step of conformal coating, the method comprising:
analyzing a plurality of features to determine correlations between adjacent pairs of features; and
based on the correlations, determining that a pair of a the features were both generated based on one edge of a printed feature to which a conformal coating is applied.
32. The method of clause 31, further comprising:
based on the correlations, determining a step in the manufacturing process that is involved in creation of a defect.
33. The method of clause 31 or 32 wherein the analyzing comprises analyzing the placement of the features.
34. A computer program comprising computer-readable code means that, when executed by a computer system, instructs the computer system to perform a method according to any one of clauses 1 to 13 or 28 to 33.

The breadth and scope of the present the techniques disclosed herein should not be limited by any of the above-described exemplary embodiments, but should be defined only in accordance with the following claims and their equivalents.

The invention claimed is:

1. A non-transitory computer readable medium that stores a set of instructions that is executable by at least one processor of a computing device to cause the computing device to perform operations for identifying features in an image taken by an inspection tool, the features being a part of an array of features formed by a multi-step semiconductor lithography process, the operations comprising:

analyzing variations in features contained or indicated in the image, including:

determining a contour of each of the features; and determining a variation of a center of mass of each of the features;

after contouring and determining centers of mass, removing distortion from the image by decomposing a grid distortion of determined centers of mass into a static and time-varying scanning electron microscope contribution and a real distortion on wafer;

determining correlations between the variations of the center of mass of different features in a first column of the array and variations of the center of mass of different features in columns of the array adjacent to the first column;

associating features of the image with steps of the multi-step process based at least in part on results of the determining of correlations, wherein one column of the array is associated with one step of the multi-step process; and determining a step in the multi-step process that contributes to creation of a defect, based on the correlations, for facilitating a determination of a remedial action to be performed, wherein the remedial action includes adjusting the step to be applied to subsequent substrates, adjusting subsequent steps to be performed on a same substrate, or reworking an already processed substrate.

2. The non-transitory computer readable medium of claim 1, wherein the variations are variations in a position or a shape of the features.

3. The non-transitory computer readable medium of claim 2, wherein the variations are variations in the position of one or more of:

geometric midpoints of the features;

centerlines of the features;

edges of the features;

dimensions of the features; or centers of parts of the features.

4. The non-transitory computer readable medium of claim 1, wherein analyzing variations comprises determining the correlation between variations of a first feature and variations of each of n adjacent features, where n is less than 4.

5. The non-transitory computer readable medium of claim 4, wherein determining correlations comprises determining the correlation between variations of adjacent features.

6. The non-transitory computer readable medium of claim 1, wherein associating features of the image comprises associating features having correlated variations to a same process step.

7. The non-transitory computer readable medium of claim 1, wherein associating features of the image further comprises:

dividing the features into a plurality of sets having similar levels of correlation; and associating each set to a respective one of the process steps.

8. The non-transitory computer readable medium of claim 1, wherein analyzing variations further comprises:

selecting a plurality of regions of the image, each region including a plurality of features; and determining correlations between the features of different regions.

9. The non-transitory computer readable medium of claim 8, wherein each region includes a plurality of aligned features.

10. An image analysis method for identifying features in an image of a part of an array of features formed by a multi-step process, the image analysis method performed by an image analysis apparatus having one or more data processing units and the image analysis method comprising:

analyzing, by the image analysis apparatus, variations in features visible in the image, including:

determining a contour of each of the features; and determining a variation of a center of mass of each of the features;

after contouring and determining centers of mass, removing distortion from the image by decomposing a grid distortion of determined centers of mass into a static and time-varying scanning electron microscope contribution and a real distortion on wafer;

determining, by the image analysis apparatus, correlations between the variations of the center of mass of different features in a first column of the array and variations of the center of mass of different features in columns of the array adjacent to the first column;

associating, by the image analysis apparatus, features of the image with steps of the multi-step process based at least in part on results of the determining of correlations, wherein one column of the array is associated with one step of the multi-step process; and determining, by the image analysis apparatus, a step in the multi-step process that contributes to creation of a defect, based on the correlations, for facilitating a determination of a remedial action to be performed, wherein the remedial action includes adjusting the step to be applied to subsequent substrates, adjusting subsequent steps to be performed on a same substrate, or reworking an already processed substrate.

11. A device manufacturing method, comprising:

forming an array of features on a substrate using a multi-step process;

obtaining an image of a part of the array;

analyzing the image according to the image analysis method of claim 10 to associate features to steps of the multi-step process;

detecting a defect in a feature of the array; and performing the remedial action based upon the association of features to steps and the detected defect.

12. The non-transitory computer readable medium of claim 1, wherein the inspection tool includes a scanning electron microscope.

13. The non-transitory computer readable medium of claim 1, wherein the multi-step process includes a step of conformal deposition.

14. The non-transitory computer readable medium of claim 1, wherein the multi-step process is a sidewall assisted quadruple patterning process.

15. The non-transitory computer readable medium of claim 14, wherein the sidewall assisted quadruple patterning process comprises:

forming a resist feature on a substrate;

performing a conformal coating process to apply a first spacer on each of side walls of the resist feature;

removing the resist feature so as to leave two first spacers;

performing a second conformal coating process to form second spacer layers on each side of each of the first spacers;

chemically removing the first spacers so as to leave just the second spacers; and performing a pattern transfer step and removing the second spacers to result in a set of trenches.

16. The non-transitory computer readable medium of claim 1, wherein determining the correlations comprises:

determining a correlation vector between a given feature and an adjacent feature, the correlation vector representing a part of a variance of placement of the given feature explained by placement of the adjacent feature;

constructing a correlation matrix of the adjacent features; and calculating coefficients of multiple correlations through the correlation vector and the correlation matrix to quantify strength of the correlation between the given feature and the adjacent feature.

17. The non-transitory computer readable medium of claim 1, wherein the operations further comprise:

identifying a column of the array where a defect is located.

* * * * *